(12) United States Patent
Letor et al.

(10) Patent No.: US 12,278,460 B2
(45) Date of Patent: Apr. 15, 2025

(54) PULSE GENERATOR CIRCUIT, RELATED LASER SYSTEM AND METHOD

(71) Applicants: STMicroelectronics S.r.l., Agrate Brianza (IT); STMicroelectronics (Rousset) SAS, Rousset (FR)

(72) Inventors: Romeo Letor, Mascalucia (IT); Antoine Pavlin, Puyricard (FR); Alfio Russo, Acireale (IT); Nadia Lecci, Tremestieri Etneo (IT)

(73) Assignees: STMicroelectronics (Rousset) SAS, Rousset (FR); STMicroelectronics S.r.l., Agrate Brianza (IT)

( * ) Notice: Subject to any disclaimer, the term of this patent is extended or adjusted under 35 U.S.C. 154(b) by 982 days.

(21) Appl. No.: 17/123,712

(22) Filed: Dec. 16, 2020

(65) Prior Publication Data

US 2021/0218223 A1  Jul. 15, 2021

(30) Foreign Application Priority Data

Dec. 20, 2019  (IT) .......................... 102019000025132

(51) Int. Cl.
*H01S 3/00* (2006.01)
*G01S 7/484* (2006.01)
(Continued)

(52) U.S. Cl.
CPC ............ *H01S 5/0428* (2013.01); *G01S 7/484* (2013.01); *H01S 5/042* (2013.01);
(Continued)

(58) Field of Classification Search
CPC .... H01S 5/06216; H01S 5/06825; H01S 5/04; H01S 5/042; H01S 5/0427; H01S 5/0428
See application file for complete search history.

(56) References Cited

U.S. PATENT DOCUMENTS 5,736,881 A   4/1998  Ortiz
5,936,598 A * 8/1999  Hayama ............... G09G 3/3674
                                                   345/212
(Continued)

FOREIGN PATENT DOCUMENTS

CN   102097934 A    6/2011
CN   106063104 A   10/2016
(Continued)

OTHER PUBLICATIONS

Osram, "LiDar Teach-In," OSRAM Licht AG, Jun. 20, 2018, 22 pages, Munich, DE.

*Primary Examiner* — Kinam Park
(74) *Attorney, Agent, or Firm* — Slater Matsil, LLP

(57) ABSTRACT

An embodiment pulse generator circuit is configured to apply a current pulse to two output terminals. The pulse generator circuit comprises an LC resonant circuit comprising an inductance and a capacitance connected in series between a first node and a negative input terminal. The pulse generator circuit comprises a charge circuit configured to charge the capacitance via a supply voltage, a first electronic switch configured to selectively short-circuit the two output terminals, a second electronic switch configured to selectively connect the two output terminals in parallel with the LC resonant circuit, and a control circuit configured to drive the first and the second electronic switch.

20 Claims, 10 Drawing Sheets

(51) Int. Cl.
*H01S 5/042* (2006.01)
*H01S 5/062* (2006.01)
*H03K 17/687* (2006.01)
*H01S 5/026* (2006.01)

(52) U.S. Cl.
CPC ..... *H01S 5/06216* (2013.01); *H03K 17/6871* (2013.01); *H01S 5/0261* (2013.01)

(56) References Cited

U.S. PATENT DOCUMENTS

| | | |
|---|---|---|
| 9,368,936 B1 | 6/2016 | Lenius et al. |
| 9,935,618 B1 | 4/2018 | Fenigstein |
| 2003/0016711 A1 | 1/2003 | Crawford |
| 2007/0262724 A1 | 11/2007 | Mednik |
| 2010/0315572 A1 | 12/2010 | Locascio |
| 2015/0002115 A1 | 1/2015 | Shenoy et al. |
| 2016/0036327 A1 | 2/2016 | Nam et al. |
| 2018/0109074 A1 | 4/2018 | Gassend et al. |
| 2018/0188360 A1 | 7/2018 | Berger et al. |
| 2018/0278017 A1* | 9/2018 | Mignoli ................ H01S 5/0428 |
| 2018/0375503 A1* | 12/2018 | Lin ........................ H02M 1/38 |
| 2018/0375504 A1* | 12/2018 | Lin .................. H03K 17/04123 |
| 2019/0229493 A1 | 7/2019 | Stern |
| 2019/0386460 A1 | 12/2019 | Barnes et al. |
| 2020/0178361 A1 | 6/2020 | Oka |
| 2020/0388987 A1 | 12/2020 | Moore |
| 2021/0098965 A1 | 4/2021 | Crawford |
| 2021/0333362 A1 | 10/2021 | Huang |
| 2022/0013984 A1 | 1/2022 | Letor et al. |

FOREIGN PATENT DOCUMENTS

| | | |
|---|---|---|
| EP | 3629462 A1 | 4/2020 |
| JP | 6188579 A | 5/1986 |
| JP | H05157626 | 6/1993 |
| JP | 2003188693 A | 7/2003 |
| JP | 2009260030 A | 11/2009 |
| WO | 2018041867 A1 | 3/2018 |

* cited by examiner

PULSE GENERATOR CIRCUIT, RELATED LASER SYSTEM AND METHOD

CROSS-REFERENCE TO RELATED APPLICATIONS

This application claims the benefit of Italian Application No. 102019000025132, filed on Dec. 20, 2019, which application is hereby incorporated herein by reference.

TECHNICAL FIELD

The embodiments of the present description refer to a pulse generator circuit, such as a pulse generator circuit for laser diodes.

BACKGROUND

In many applications it may be required to generate narrow high current pulses.

FIG. 1 shows an exemplary pulse generator circuit 20 configured to provide a current pulse to a load 30.

In the example considered, the pulse generator circuit 20 comprises:
- a positive and a negative supply terminal 200 and 202 configured to be connected to a DC voltage source 10, thereby receiving a supply voltage Vcc,
- a positive and a negative output terminal 204 and 206 configured to be connected to the load 30 for providing an output current Iout and an output voltage Vout to the load 30, wherein the positive output terminal 204 is coupled and typically directly connected to the positive input terminal 200, and
- an electronic switch Q1, such as a Field-Effect Transistor (FET), such as an n-channel FET, configured to selectively connect the negative output terminal 206 to the negative input terminal 202.

For example, in FIG. 1, the load 30 is a laser diode D, i.e. the laser diode D is connected (e.g., directly) between the terminals 204 and 206. Thus, in the example considered, the pulse generator circuit 20 is configured as laser diode driver. For example, in many applications, such as in a Light Detection and Ranging (LiDAR) system, narrow current pulses having rise and fall times in a range between 50 ps (picoseconds) and 300 ps, typically in the range of 100 ps, have to be applied to the diode D.

In the example considered, a current pulse may be applied to the diode D by closing the electronic switch $Q_1$, whereby the diode D is connected to the supply voltage Vcc.

As shown in FIG. 1, often a capacitor $C_1$ is added in order to stabilize the supply voltage Vcc. Specifically, typically this capacitor $C_1$ is connected (e.g., directly) between the input terminals 200 and 202. In FIG. 1 is also shown a resistance $R_1$ connected in series with the capacitor $C_1$, which may represent parasitic resistances or a resistor intentionally connected between the terminal 200 and the capacitor $C_1$. Accordingly, during a charge phase (switch $Q_1$ opened), the capacitor $C_1$ is charged (via the resistance $R_1$) to a voltage $V_1$ corresponding approximately to the supply voltage Vcc. Conversely, when the switch $Q_1$ is closed, the diode D is connected to the capacitor $C_1$. For example, the respective drive signal DRV for controlling the switching of the electronic switch $Q_1$ may be provided by a control circuit 208 and driver circuit 210.

On the one hand, the generation of several pulses within a very short time frame is almost impossible with the architecture shown in FIG. 1, because the capacitor $C_1$ has to be recharged. On the other hand, the input voltage Vcc has to be greater than the laser diode drop voltage in order to generate the required di/dt ratio. However, using a supply voltage Vcc being higher than the laser diode voltage drop may generate safety issues in case the switch $Q_1$ is permanently closed, e.g., due to a fault.

Moreover, the conductive traces used to connect the diode D to the capacitor $C_1$ may have associated stray inductances, schematically shown in FIG. 1 via an inductance $L_1$ connected between the load 30 and the capacitor $C_1$. Often the stray inductance $L_1$ cannot be minimized to obtain required di/dt, such as 100 ps rise and fall times with a high current pulse amplitude, because the length of the commutation loop is also strongly influenced by capacitances of the circuit, and it is also difficult to obtain a total stray inductance below several nH. For this reason, the maximum obtainable di/dt is usually smaller than 40 A/ns and the rise time is often greater than 1 ns. Moreover, this inductance may result in voltage overshoots which may damage the laser diode D.

The above issues also imply that the value of the output current Iout provided to the laser diode D is difficult to be controlled, because the current Iout depends on the impedance of the commutation loop. For example, a parasitic output capacitance of the laser driver circuit 20 may enlarge the real current pulse seen by the laser diode D.

SUMMARY

Considering the foregoing, it is therefore an object of various embodiments to provide improved solutions for pulse generator circuits.

According to one or more embodiments, one or more of the above objects are achieved by a pulse generator circuits having the distinctive elements set forth specifically in the ensuing claims. Embodiments moreover concern a related laser system and method.

The claims form an integral part of the technical teaching of the description provided herein.

As mentioned before, various embodiments of the present disclosure relate to a pulse generator circuit configured to apply a current pulse to a load. For example, the pulse generator circuit may be used in a laser system, such as a LiDAR system.

In various embodiments, the pulse generator circuit comprises a positive and a negative input terminal for receiving a supply voltage and two output terminals for providing the current pulse to the load. In various embodiments, an inductance and a capacitance are connected in series between a first node and the negative input terminal, thereby forming an LC resonant circuit having a given resonant period. In various embodiments, a charge circuit is configured to charge the capacitance via the supply voltage. For example, in various embodiments, the inductance, such as an inductor, is connected to the first node and the capacitance, such as a capacitor, is connected to the negative input terminal. In this case, the charge circuit may comprise a resistance, such as a resistor, and optionally an electronic switch connected between the positive supply terminal and an intermediate node between the inductance and the capacitance.

In various embodiments, a first electronic switch is connected between the two output terminals and configured to selectively short-circuit the two output terminals as a function of a first drive signal, and a second electronic switch is configured to selectively connect the two output terminals in parallel with the LC resonant circuit as a function of a second drive signal. For example, the first and the second electronic switch may be connected in series between the first node and the negative input terminal, wherein the two output terminals may be connected to the first node and an intermediate node between the first and the second electronic switch. Alternatively, the second and the first electronic switch may be connected in series between the first node and the negative input terminal, and the two output terminals may be connected to an intermediate node between the first and the second electronic switch, and the negative input terminal.

In various embodiments, a control circuit is configured to generate the first and the second drive signals. Specifically, in various embodiments, the control circuit is configured to drive the first and second electronic switch during each switching cycle with four switching periods. Specifically, for a first time-interval, the control circuit closes the first electronic switch and opens the second electronic switch, wherein the two output terminals are disconnected from the LC resonant circuit and the capacitance is charged via the charge circuit. For a following second time-interval, the control circuit closes both the first and the second electronic switch, wherein the two output terminals are connected in parallel with the LC resonant circuit and the two output terminals are short-circuited, whereby the LC resonant circuit oscillates with the given resonant period. For a following third time-interval, the control circuit opens the first electronic switch and closes the second electronic switch, wherein the two output terminals are connected in parallel with the LC resonant circuit and the LC resonant circuit provides a current to the two output terminals. For a following fourth time-interval, the control circuit closes both the first and the second electronic switch, wherein the two output terminals are connected in parallel with the LC resonant circuit and the two output terminals are short-circuited, whereby the LC resonant circuit oscillates with the given resonant period.

Accordingly, during the second time-interval, the current provided by the LC resonant circuit oscillates with a given maximum current value. In various embodiments, the control circuit is configured to start the third time-interval when the current provided by the LC resonant circuit reaches (approximately) the given maximum current value. For example, the control circuit may be configured to use a (constant) duration for the second time-interval, which is selected in a range between 90% and 110%, preferably between 95% and 105%, of one-fourth (¼) of the given resonant period. Alternatively, the control circuit may be configured to receive data identifying a requested current amplitude to be provided to the two output terminals, and determine the duration of the second time-interval as a function of the data identifying a requested current amplitude.

In various embodiments, the duration of the third time-interval is selected in a range between 500 ps and 20 ns, preferably between 1 ns and 2 ns.

In various embodiments, the control circuit is configured to start the first time-interval when the current provided by the LC resonant circuit reaches (approximately) zero. For example, the duration of the fourth time-interval may be selected such that the sum of the durations of the second, third and fourth time-interval in a range between 90% and 110%, preferably between 95% and 105%, of the given resonant period, and preferably corresponds to the given resonant period.

BRIEF DESCRIPTION OF THE DRAWINGS

The embodiments of the present disclosure will now be described with reference to the annexed plates of drawings, which are provided purely to way of non-limiting example and in which.

The features and advantages of the present invention will become apparent from the following detailed description of practical embodiments thereof, shown by way of non-limiting example in the accompanying drawings, in which.

DETAILED DESCRIPTION OF ILLUSTRATIVE EMBODIMENTS

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

Figure 1:
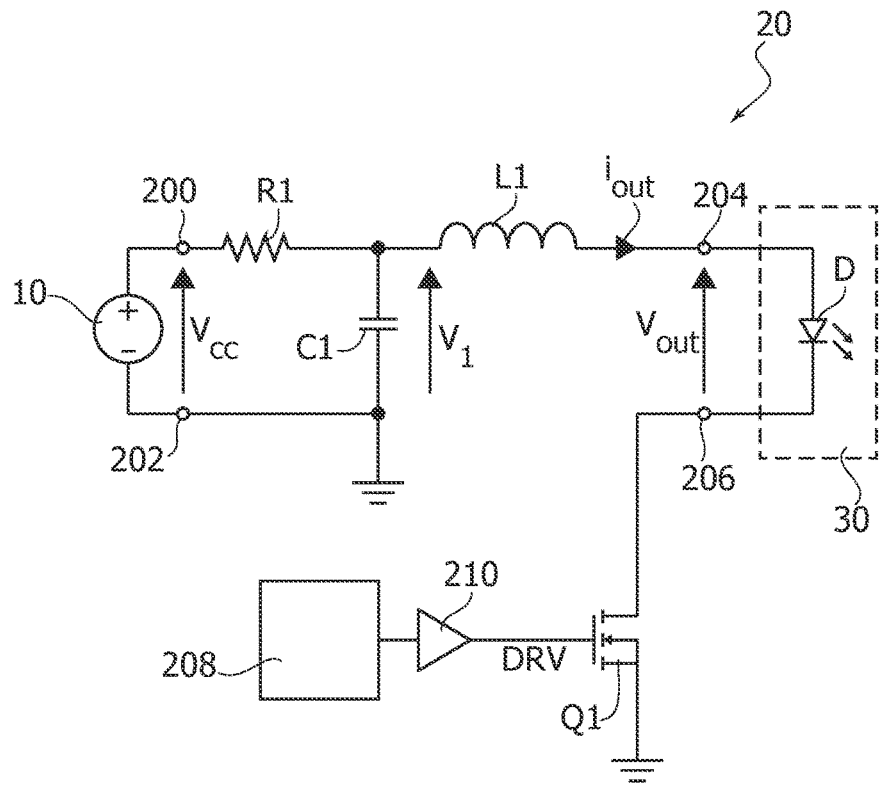
FIG. 1 shows a circuit schematic of a pulse generator circuit.

In FIGS. 2 to 15 described below, parts, elements or components that have already been described with reference to FIG. 1 are designated by the same references used previously in these figures. The description of these elements has already been made and will not be repeated in what follows in order not to burden the present detailed description.

Figure 2A:
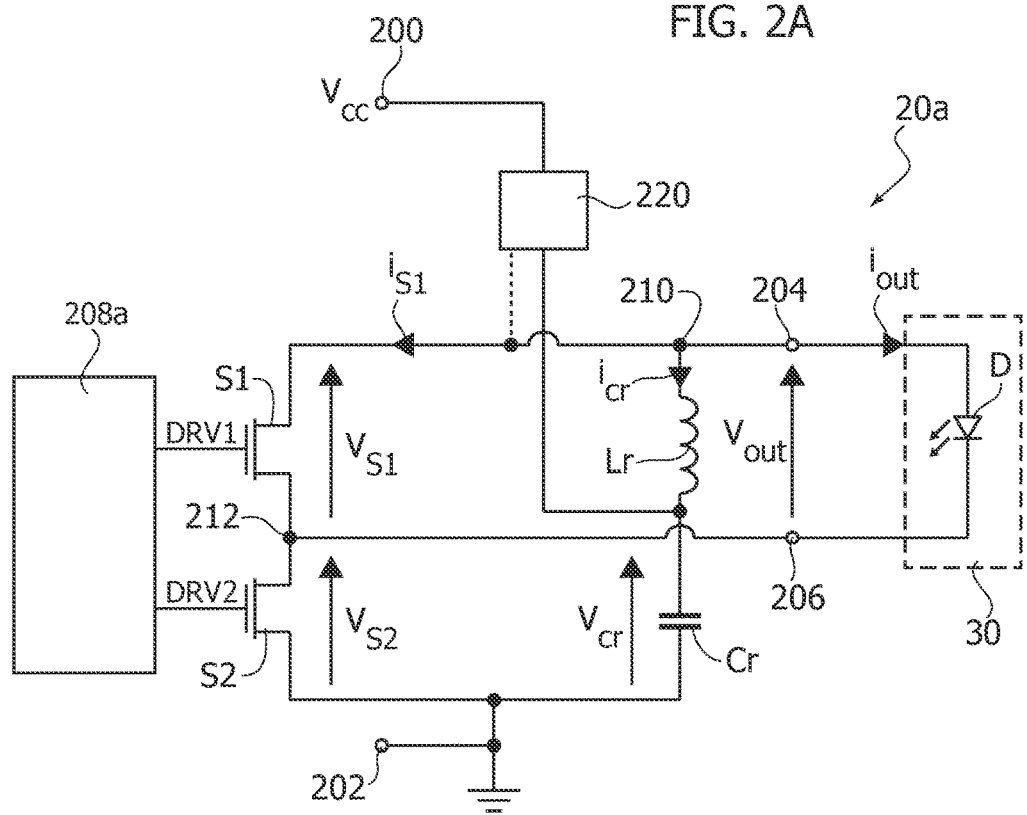
FIGS. 2A, 2B, 2C, 2D and 2E show a circuit schematic of a first embodiment of a pulse generator circuit.

FIG. 2A shows an embodiment of a pulse generator circuit 20a, such as a laser diode driver.

In the embodiment considered, the pulse generator circuit 20a comprises:
- a positive and a negative supply terminal 200 and 202 configured to receive a DC supply voltage Vcc, wherein the negative terminal 202 represents a reference voltage, such as ground; and
- a positive and a negative output terminal 204 and 206 configured to be connected to a load 30 for providing an output current Iout to the load 30.

For example, in various embodiments, the load 30 is a laser diode D, i.e. the laser diode D is connected (e.g., directly) between the terminals 204 and 206. Generally, the pulse generator circuit 20a and optionally the laser diode D may be integrated in an integrated circuit. Accordingly, in this case, the integrated circuit may comprise two power supply pads (of the die of the integrated circuit) or pins (of a respective package of the integrated circuit) connected to the terminals 200/202, and optionally (if the diode D is not integrated in the integrated circuit) and two further pads or pins for connection to the diode D.

In the embodiment considered, the pulse generator circuit 20a comprises:
- an LC resonant circuit comprising an inductor Lr and a capacitor Cr connected (e.g., directly) in series between a node 210 and the terminal 202, wherein e.g., the inductor Lr is connected to the node 210 and the capacitor Cr is connected to the terminal 202;
- a charge circuit 220 configured to charge the capacitor Cr;
- a first electronic switch S1 (having a current-path) connected (e.g., directly) between the node 210 and a node 212 connected (e.g., directly) to the terminal 206, i.e. the electronic switch S1 is connected in parallel with the load 30 and is thus configured to selectively short-circuit the output terminals 204/206, i.e. the load 30; and
- a second electronic S2 (having a current-path) connected (e.g., directly) in series between the node 212 and the terminal 202, i.e. the second electronic S2 is configured to selectively connect the output terminals 204/206, i.e. the load 30, in parallel with the LC resonant circuit Lr/Cr; and
- a control circuit 208a configured to generate drive signals DRV1 and DRV2 for the control terminals of the electronic switches S1 and S2.

For example, FIGS. 2B, 2C, 2D and 2E show possible embodiments of charge circuits 220a, 220b, 220c and 220d.

In general, the charge circuit 220 is configured to charge the capacitor Cr via the supply voltage Vcc. For example, the charge circuit 220 may be connected (e.g., directly):
- between the terminal 200 and the node 210, thereby charging the capacitor Cr through the inductor Lr, or preferably, between the terminal 200 and the intermediate node between the node 210, thereby directly charging the capacitor Cr.

Figure 2B:
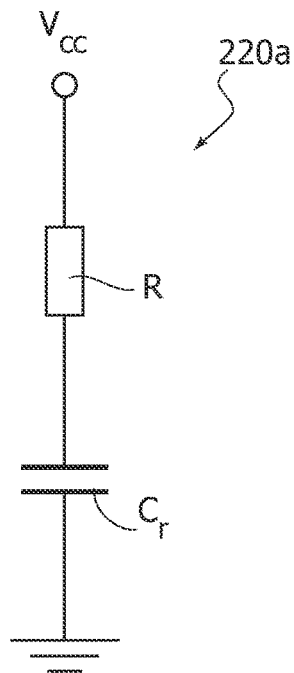

For example, FIG. 2B shows an embodiment of a charge circuit 220a, wherein a resistance R is connected (e.g., directly) between the terminal 200 and the capacitor Cr, e.g., between the terminal 200 and the intermediate node between the inductor Lr and the capacitor Cr.

Thus, in this case, the capacitor Cr is charged when the voltage $V_{cr}$ at the capacitor is smaller than the supply voltage Vcc.

In various embodiments, the charge circuit 220 is configured to selectively charge the capacitor Cr when the electronic switch S2 is opened.

Figure 2C:
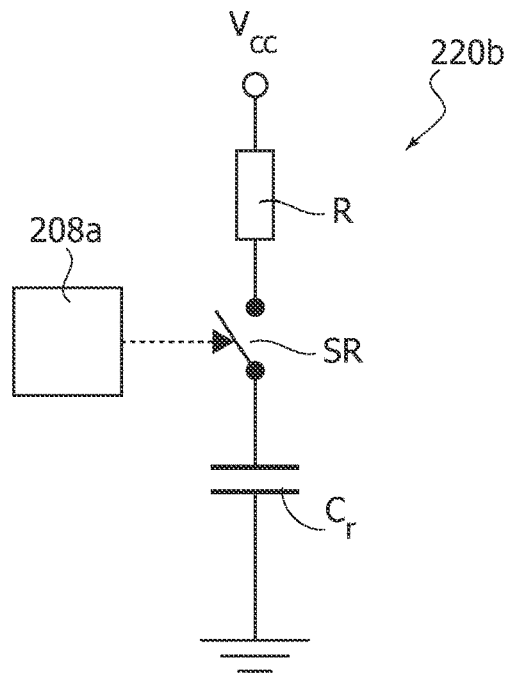

For example, FIG. 2C shows an embodiment of a charge circuit 220b, wherein a resistance R and an electronic switch SR are connected (e.g., directly) in series between the terminal 200 and the capacitor Cr, e.g., between the terminal 200 and the intermediate node between the inductor Lr and the capacitor Cr.

Figure 2D:
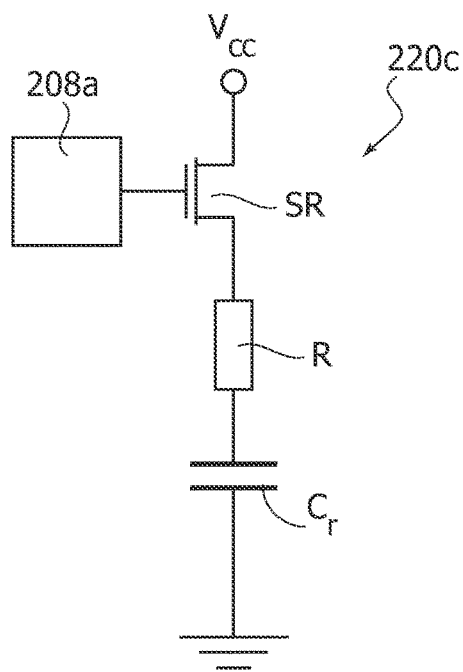
Figure 2E:
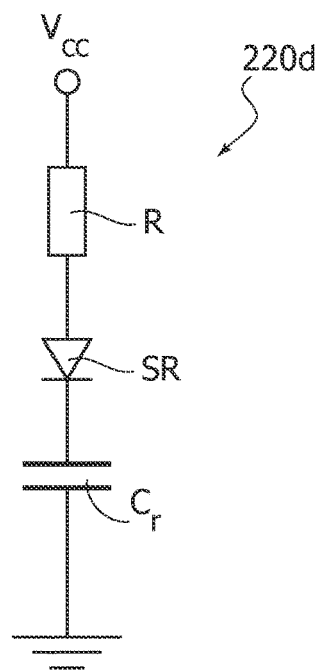
Figure 3A:
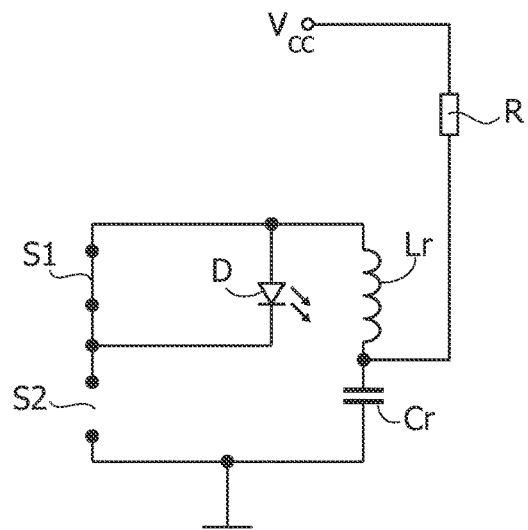
FIGS. 3A, 3B, 3C and 3D show embodiments of the switching states of the pulse generator circuit of FIG. 2.
Figure 3B:
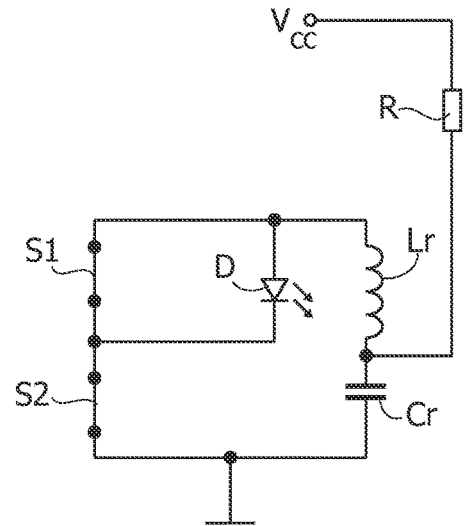
Figure 3C:
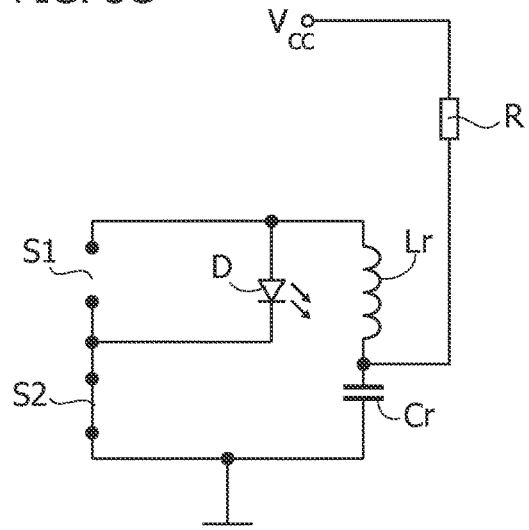
Figure 3D:
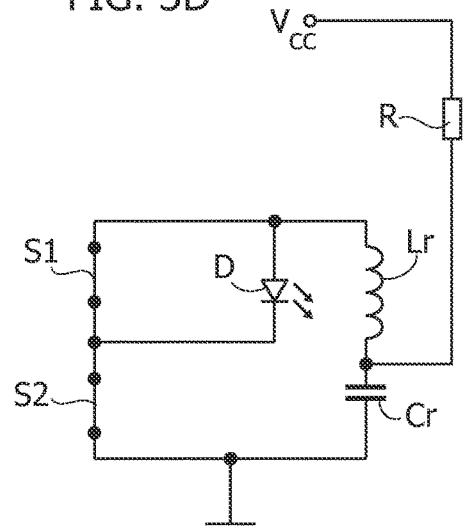

As shown in FIGS. 2D and 2E, such an electronic switch SR may be implemented with a controllable electronic switch, such as a FET, or a diode.

Accordingly, the control circuit 208a may be configured to also generate the drive signal for the electronic switch SR. For example, this drive signal may correspond to the inverted version of the drive signal DRV2 for the electronic switch S2.

In various embodiments, the resistance R may be a parasitic resistance or may be implemented with a resistor. For example, in various embodiments the resistance R is in a range between 0.1 ohm and 3000 hm. In general, when the electronic switch SR is used, the resistance may also be small (e.g., between 0.02 Ohm and 10 Ohm), because the electronic switch SR may be used to decouple the LC resonant circuit. For example, in this case, the resistance R may also correspond to the switch-on resistance of the electronic switch SR. Conversely, in the absence of an electronic switch SR, the resistance R should be greater (e.g., between 100 Ohm and 300 Ohm) in order to decouple the oscillation of the LC resonant circuit from the supply voltage.

In various embodiments, the inductor Lr and the capacitor Cr may be external with respect to the integrated circuit of the pulse generator circuit 20a. For example, the inductor Lr and the capacitor Cr may be connected in series between the pins/pads of such an integrated circuit which are connected to the terminals 204 and 202 of the pulse generator circuit 20a.

In various embodiments the inductance of the inductor Lr is in a range between 1 nH to 1 uH, preferably between 5 and 50 nH, and the capacitance of the capacitor Cr is in a range between 100 nF to 10 uF, preferably between 200 and 800 nF.

In various embodiments, the electronic switches may be Field-Effect Transistors (FET), such as Metal-Oxide-Semiconductor Field-Effect Transistors (MOSFET) or preferably Gallium nitride (GaN) transistors. Accordingly, the control circuit 208a may be configured to generate drive signals DRV1 and DRV2 for the gate terminals of the FETs S1 and S2. For this purpose, the control circuit 208a may comprise FET driver circuits for generating the drive signals DRV1 and DRV2, such as a high-side driver for the FET S1 and a low-side driver circuit for the FET S2.

For example, in various embodiments, the electronic switches S1 and S2 are n-channel FET. Accordingly, in this case, the drain terminal of the FET S1 is connected (e.g., directly) to the terminal 204/node 210, the source terminal of the FET S1 is connected (e.g., directly) to the terminal 206/node 212, the drain terminal of the FET S2 is connected (e.g., directly) to the terminal 206/node 212 and the source terminal of the FET S2 is connected (e.g., directly) to the terminal 202.

Figure 4:
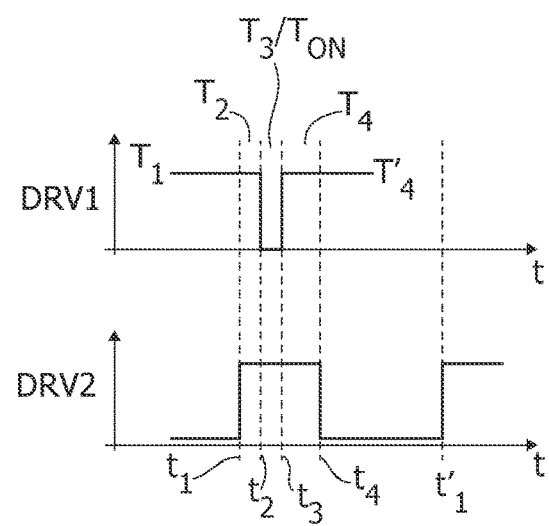
FIG. 4 shows an embodiment of drive signals used in the pulse generator circuit of FIG. 2.

FIG. 4 shows in this respect an embodiment of the drive signals DRV1 and DRV2 generated by the control circuit 208a, and FIGS. 3A, 3B, 3C and 3D show the respective switching states of the pulse generator circuit 20a.

Specifically, during/for a first time-interval $T_1$ (see also FIG. 3A), the control circuit 208a closes the first electronic switch S1 (e.g., by setting the signal DRV1 to high) and opens the second electronic switch S2 (e.g., by setting the signal DRV1 to low), whereby the load 30/diode D is short-circuited. Moreover, the resonant circuit Lr/Cr is connected via the charge circuit 220, such as a resistance R, to the supply voltage Vcc, whereby the capacitor Cr is charged.

At an instant $t_1$ (end of the interval $T_1$) the control circuit 208a closes the first electronic switch S1 (e.g., by setting the signal DRV1 to high) and closes the second electronic switch S2 (e.g., by setting the signal DRV1 to high). Thus, during/for a following second time-interval $T_2$ (see also FIG. 3B) the load 30/diode D is short-circuited, and also the resonant circuit Lr/Cr is short circuited, which thus oscillates with a given resonant frequency Fr:

$$Fr = 1/(2\pi\sqrt{LrCr}) \quad (1)$$

At an instant $t_2$ (end of the interval $T_2$) the control circuit 208a opens the first electronic switch S1 (e.g., by setting the signal DRV1 to low) and closes the second electronic switch S2 (e.g., by setting the signal DRV1 to high). Thus, during/for a following third time-interval $T_3$ (see also FIG. 3C), the load 30/diode D is connected in in parallel with the resonant circuit Lr/Cr, and is thus powered via the current $i_{CR}$ flowing through the resonant circuit Lr/Cr. Thus, the time-interval $T_3$ represents the switch-on interval $T_{ON}$ of the load 30.

At an instant $t_3$ (end of the interval $T_3$) the control circuit 208a closes the first electronic switch S1 (e.g., by setting the signal DRV1 to high) and closes the second electronic switch S2 (e.g., by setting the signal DRV1 to high). Thus, during/for a following fourth time-interval $T_4$ (see also FIG. 3D), the load 30/diode D and also the resonant circuit Lr/Cr are short circuited, whereby the resonant circuit oscillates with the resonant frequency Fr.

At an instant $t_4$ (end of the interval $T_4$) the control circuit 208a closes the first electronic switch S1 (e.g., by setting the signal DRV1 to high) and opens the second electronic switch S2 (e.g., by setting the signal DRV1 to low), whereby the load 30/diode D is short-circuited. Moreover, the resonant circuit Lr/Cr is connected via the charge circuit 220, such as a resistance R, to the supply voltage Vcc, whereby the capacitor Cr is charged.

Thus, by closing the electronic switch S2 after a time-interval $T_1$/at a next instant $t'_1$ the control circuit 208a may start a new cycle comprising the phases $T_2$, $T_3$ and $T_4$.

Figure 5:
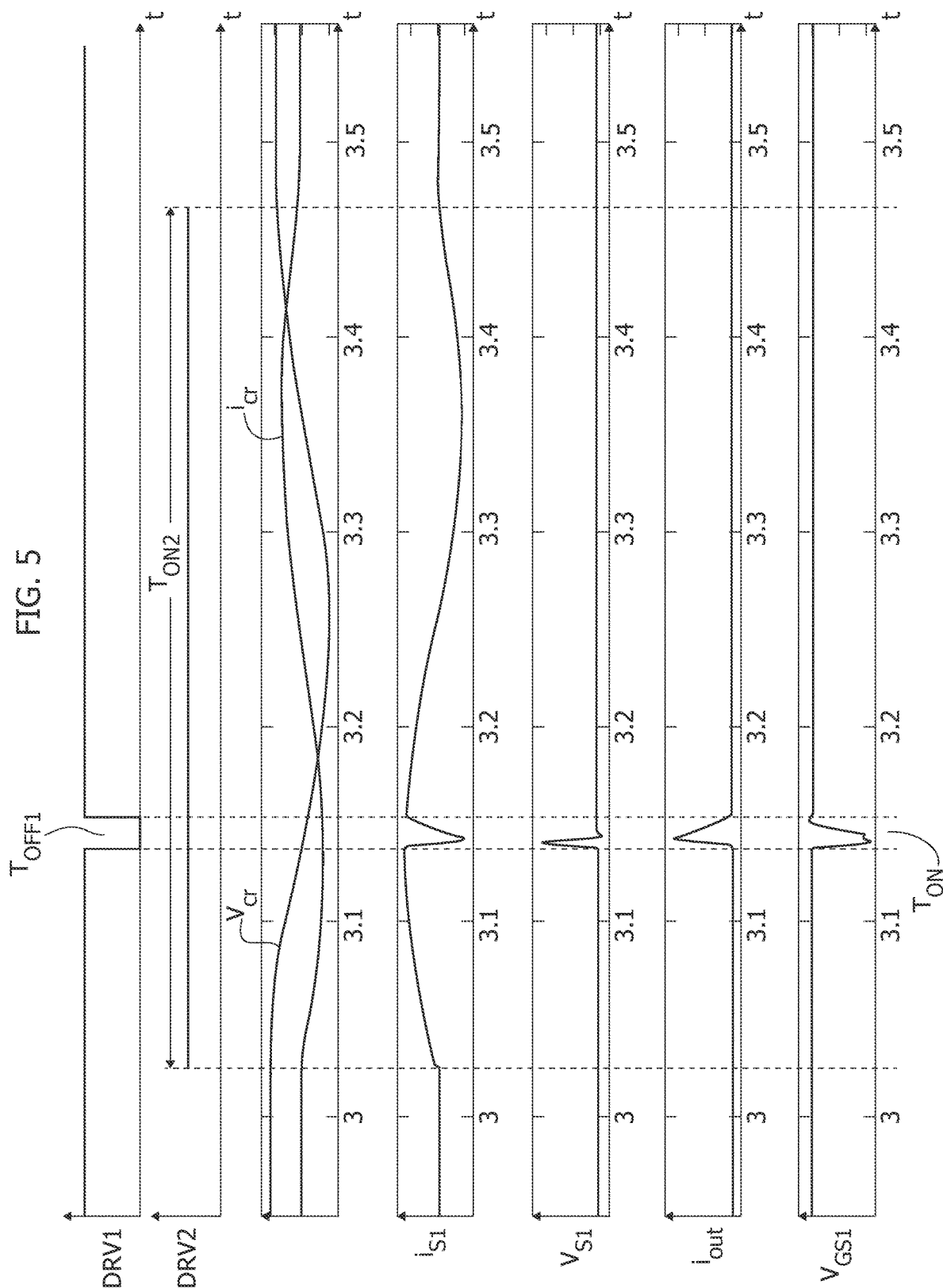
FIGS. 5 and 6 shows exemplary waveforms of the pulse generator circuit of FIG. 2.

FIG. 5 shows in this respect embodiments of the waveforms of:
the drive signals DRV1 and DRV2,
the voltage $V_{Cr}$ at the capacitor Cr and the current $i_{Cr}$, flowing through the capacitor Cr, i.e. the current flowing through the LC resonant circuit;
the current $i_{S1}$ flowing through the (current path) of the electronic switch S1;
the voltage $V_{S1}$, at the electronic switch S1;
the output current iout, i.e. the current flowing through the load 30/laser diode D.

As mentioned before, in various embodiments, the electronic switches S1 and S2 may be FET. Accordingly, in this case, the current $i_{S1}$ corresponds to the drain-source current of the FET S1, and the voltage Vs, corresponds to the drain-source voltage of the FET S1. Moreover, FIG. 5 shows for this case also a possible waveform of the gate-source voltage $V_{GS1}$ generated at the gate terminal of the FET S1 in response to the drive signal DRV1.

Figure 6:
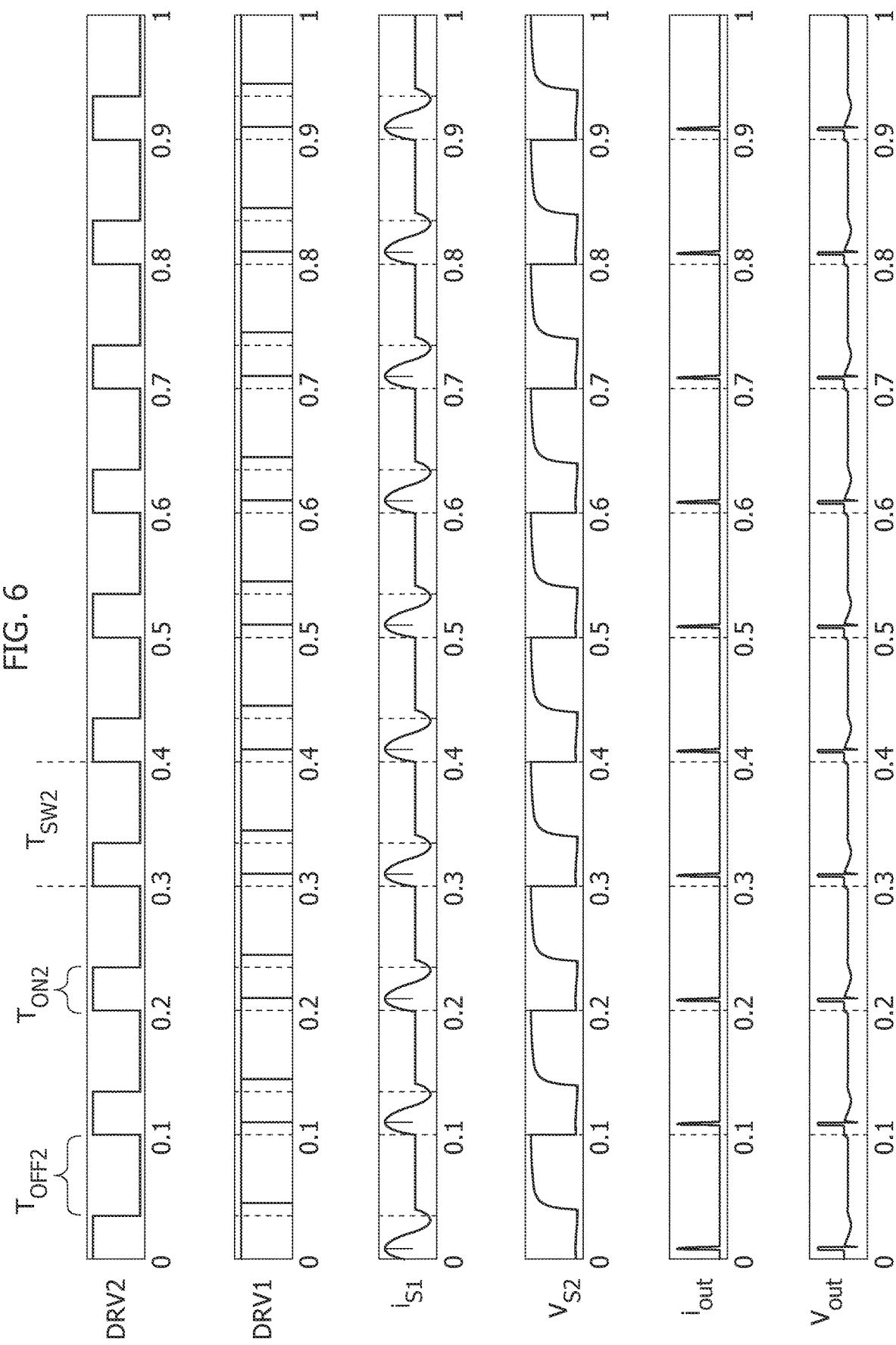

FIG. 6 shows in the context of a plurality of switching cycles embodiments of waveforms of:
the drive signals DRV1 and DRV2,
the current $i_{S1}$ flowing through the (current path) of the electronic switch S1;
the voltage $V_{S2}$ at the electronic switch S1;
the output current iout, i.e. the current flowing through the load 30/laser diode D.
the output voltage Vout, i.e. the voltage at the load 30/laser diode D.

Thus, in the embodiments described with respect to the operation shown in FIGS. 5 and 6, the drive signals DRV1 and DRV2 are pulsed signals having given switching durations $T_{SW1} = T_{ON1} + T_{OFF1}$ and $T_{SW2} = T_{ON2} + T_{OFF2}$, with $T_{SW1} = T_{SW2}$. Specifically, in various embodiments:
the switch-on time $T_{ON1}$ of the switch S1 (e.g., when the drive signal DRV1 is set to high) corresponds to $T_1 + T_2 + T_4$, and the switch-off time $T_{OFF1}$ of the switch S1 (e.g., when the drive signal DRV1 is set to low) corresponds to $T_3 = T_{ON}$; and
the switch-on time $T_{ON2}$ of the switch S2 (e.g., when the drive signal DRV2 is set to high) corresponds to $T_2 + T_3 + T_4$, and the switch-off time $T_{OFF2}$ of the switch S2 (e.g., when the drive signal DRV2 is set to low) corresponds to $T_1$.

In various embodiments, the switch-on time $T_{ON2}$ of the electronic switch S2 corresponds (approximately) to a multiple of a period $T_r = 1/Fr$ of the oscillation, i.e.:

$$T_{ON2} = i \cdot 1/Fr \quad (2)$$

where i is a positive integer number. Specifically, in various embodiments, i corresponds to one, i.e. $T_{ON2} = 1/Fr$.

The inventors have observed that the electronic switch S2 may be opened in this way at zero current, i.e. at the instants when the current $i_{S1}$ is zero. Moreover, the voltage $V_{Cr}$ reaches in this case its maximum value, thereby improving the recharging of the capacitor Cr. Generally, also an approximate value of the switch-on time $T_{ON2}$ may be used. For example, in various embodiments, the actual switch-on time $T_{ON2}'$ used by the control circuit 208a may be in a range between 90% and 110% of the "ideal" value $T_{ON2}$ shown in equation (2), preferably between 95% and 105%.

Thus, in various embodiments, the charge circuit 220, such as a resistance R (optionally connected via a switch SR to the capacitor Cr), charges the capacitor Cr during the time interval $T_1$ substantially to the value of the supply voltage Vcc.

Next, the control unit 208a closes the switch S2 for a duration $T_{ON2}$ close to 1/Fr (or a multiple thereof), where $Fr = 1/(2\pi\sqrt{LrCr})$ is the resonant frequency of the LC resonant circuit. Accordingly, the values Vcc, Lr and Cr define the resonant peak current $i_{max}$ flowing through the LC resonant tank:

$$i_{max} = \sqrt{Cr/Lr} \cdot Vcc \quad (3)$$

The control unit 208a opens then the switch S1 for the time-interval $T_{OFF1} = T_3 = T_{ON}$. For example, in various embodiments, the time $T_{ON}$ corresponds to the desired laser diode pulse current duration. Specifically, when the electronic switch S1 is opened, the current provided by the LC resonant circuit is forced to flow immediately through the output terminals 204/206, i.e. the load 30/laser diode D.

Thus, by controlling the duration of the interval $T_2$, the control unit 208a may select the value of the current $i_{out}$ to be provided to the load 30/laser diode D. For example, in various embodiments, the duration of the time interval $T_2$ corresponds to the instants when the resonant current $i_{Cr}$ reaches its peak value $i_{max}$, e.g.:

$$T_2 = \frac{1}{4}Tr = 1/(4Fr) \quad (4)$$

Generally, also an approximate value of the above time $T_2$ may be used. For example, in various embodiments, the actual switch-on time $T_2'$ used by the control circuit 208a may be in a range between 90% and 110% of the value $T_2$ shown in equation (4), preferably between 95% and 105%.

In various embodiments, the time $T_2$ is constant (even though this time may be settable/programmable) in order to generate pulses with the same current value.

When the control circuit 208a then closes the switch S1 at the instant $t_3$ (end of interval $T_3$), the load 30/laser diode D is short-circuited and the current iout goes to zero. In parallel, the LC resonant circuit continues to oscillate until the control circuit 208a opens the electronic switch S2. As mentioned before, the control unit 208a may open the electronic switch S2 at the instants when the current $i_{CR}$ crosses zero.

Once the electronic switch S2 is opened, the capacitor Cr is recharged via the charge circuit 220. As mentioned before, due to the additional time interval $T_4$ (which permits to obtain a duration $T_{ON2}$ close to 1/Fr) the capacitor Cr may already be recharged in part with the residual energy stored in the resonant loop.

Accordingly, in the embodiment considered, the inductor Lr essentially implements a current source. This is particularly useful for diodes, such a laser diodes D, insofar as diodes require rather a requested current than a requested voltage. Moreover, this permits that the supply voltage Vcc is smaller than the voltage-drop of the laser diode D because the current $i_{Cr}$ will flow through the diode regardless the value of the voltage-drop.

Figure 7:
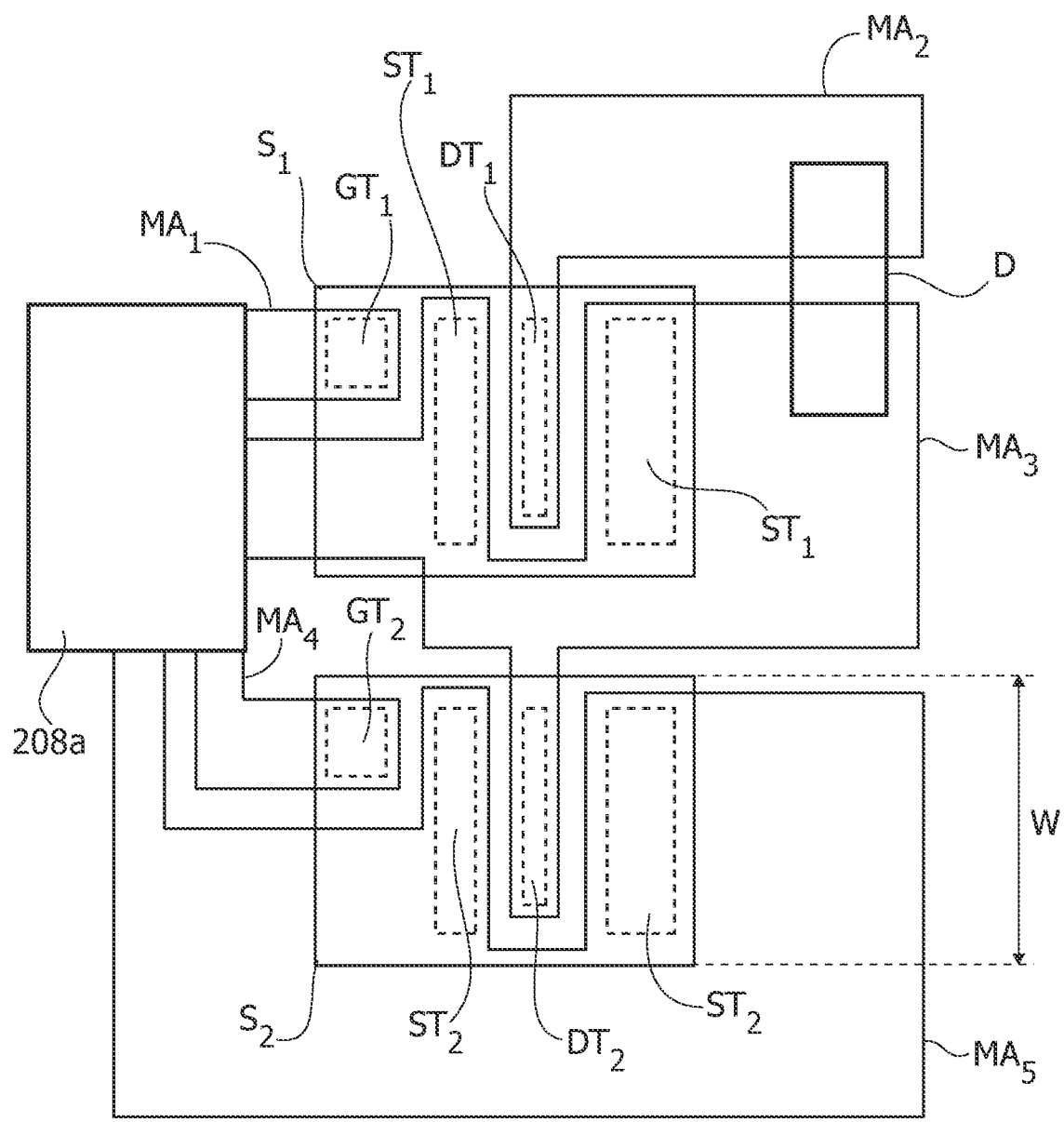
FIG. 7 shows schematically an embodiment of an integrated circuit layout able to implement the pulse generator circuit of FIG. 2.

FIG. 7 shows a possible embodiment of a printed circuit layout adapted to be used to mount the electronic switches S1/S2, the diode D, and the control circuit 208a.

In the embodiment considered, the electronic switches are FETs. Specifically, the electronic switch S1 comprises a gate terminal $GT_1$, at least one source terminal $ST_1$ and at least one drain terminal $DT_1$. Similarly, the electronic switch S2 comprises a gate terminal $GT_2$, at least one source terminal $ST_2$ and at least one drain terminal $DT_2$.

Accordingly, the printed circuit board may comprise:
a first metallic area/track $MA_1$ for connecting the gate terminal $GT_1$ to the terminal of the control circuit 208a providing the drive signal DRV1;
a second metallic area/track $MA_2$ for connecting the drain terminal $DT_1$ to the terminal 204/anode of the diode D;
a third metallic area/track $MA_1$ for connecting the source terminal $ST_1$ to the terminal 206/cathode of the diode D and the drain terminal $DT_2$;
a fourth metallic area/track $MA_4$ for connecting the gate terminal $GT_2$ to the terminal of the control circuit 208a providing the drive signal DRV2; and
a fifth metallic area/track $MA_5$ for connecting the source terminal $ST_2$ to the terminal 202, such as a ground pin of the control circuit 208a.

In general, the components S1, S2, D and/or 208a may have a respective package with pins or may be mounted directly on the PCB, or by using chip-on-chip technology. For example, just to provide a dimensional reference, such electronic switches (without package) may have a width W in the range of 1 mm.

Generally, also other circuit arrangements may be used, which comprise:
an LC resonant circuit comprising an inductor Lr and a capacitor Cr connected in series;
a charge circuit 229 configured to charge the capacitor Cr via the supply voltage Vcc, such as the resistor R and/or an electronic switch SR connected between the supply voltage Vcc and the capacitor Cr;
a first electronic switch S1 configured to selectively short-circuit the output terminals, i.e. the load 30/laser diode D;
a second electronic switch S2 configured to selectively connect the output terminals, i.e. the load 30/laser diode D, to the LC resonant circuit; and
a control circuit 208a configured to control the switching of the first and second electronic switch S1 and S2 with the following sequence of time intervals:
during a first time-interval $T_1$, close the first electronic switch S1 and open the second electronic switch S2;
during a second time-interval $T_2$, close the first electronic switch S1 and close the second electronic switch S2;
during a third time-interval $T_1$, open the first electronic switch S1 and close the second electronic switch S2; and
during a fourth time-interval $T_4$, close the first electronic switch S1 and close the second electronic switch S2.

Figure 8:
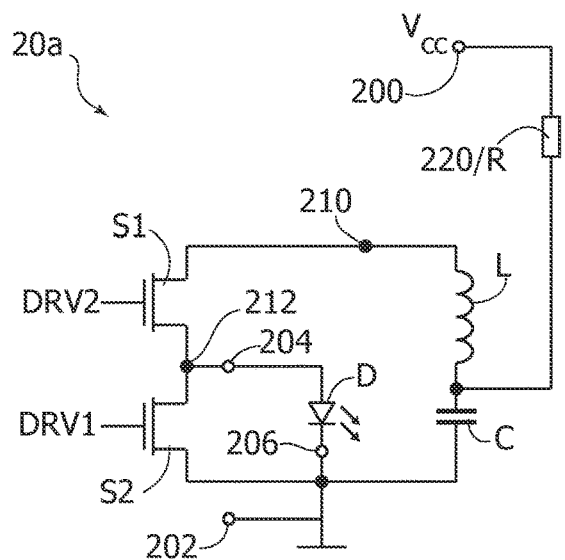
FIG. 8 shows a circuit schematic of a second embodiment of a pulse generator circuit.

For example, FIG. 8 shows an embodiment wherein a different connection is used.

Specifically, in the embodiment considered, the pulse generator circuit 20a comprises again:
a positive and a negative supply terminal 200 and 202 configured to receive the DC supply voltage Vcc, wherein the negative terminal 202 represents again a reference voltage, such as ground;
a positive and a negative output terminal 204 and 206 configured to be connected to the load 30 for providing an output current Iout to the load 30/laser diode D;
an LC resonant circuit comprising an inductor Lr and a capacitor Cr connected (e.g., directly) in series between a node 210 and the terminal 202;
a charge circuit 220, e.g., implemented with a resistance R connected (e.g., directly) between the terminal 200 and the intermediate node between the inductor Lr and the capacitor Cr;
two electronic switches S1 and S2, such as (n-channel) FET, connected (e.g., directly) between the node 210 and the terminal 202.

In FIG. 2, the output terminals 204 and 206 were connected (e.g., directly) to the node 210 and the intermediate node 212 between the electronic switches S1 and S2. Accordingly, the (high-side) electronic switch S1 was configured to short-circuit the output terminals 204 and 206, i.e. the load 30, and the (low-side) electronic switch S2 was configured to connect the output terminals 204 and 206, i.e. the load 30, in parallel with the LC resonant circuit.

Conversely, in the embodiment considered, the output terminals 204 and 206 are connected (e.g., directly) to the intermediate node 212 between the electronic switches S1/S2 and the terminal 202, respectively. Accordingly, the low-side switch (connected between the node 212 and the terminal 202) is now configured to short-circuit the output terminals 204 and 206, i.e. the load 30, and corresponds thus now to the electronic switch S1. Conversely, the high-side electronic switch is now configured to connect the output terminals 204 and 206, i.e. the load 30, in parallel with the LC resonant circuit (i.e. between the node 210 and the terminal 202) and corresponds thus now to the electronic switch S2.

Figure 9A:
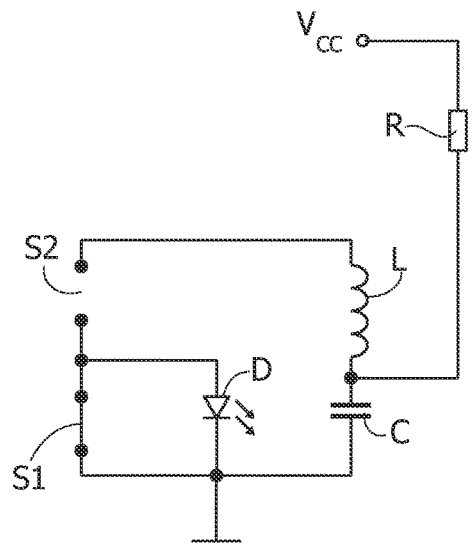
FIGS. 9A, 9B and 9C shows embodiments of the switching states of the pulse generator circuit of FIG. 8.
Figure 9B:
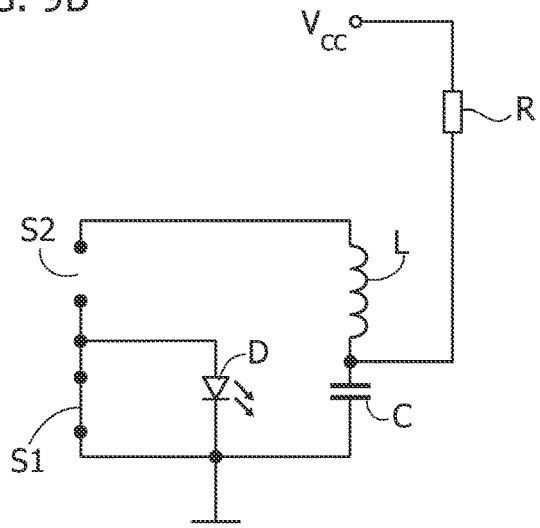
Figure 9C:
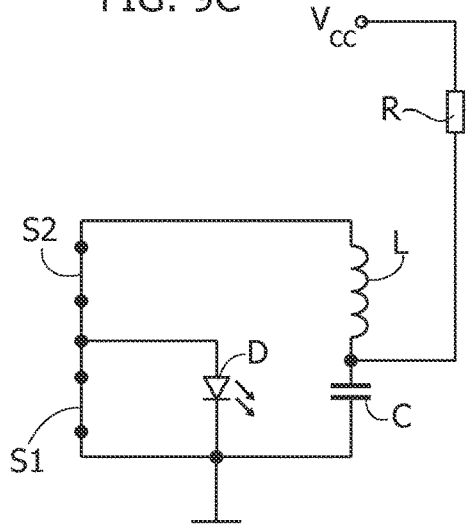
Figure 10:
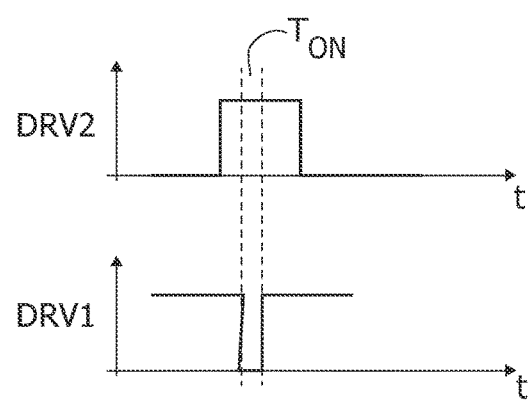
FIG. 10 shows an embodiment of drive signals used in the pulse generator circuit of FIG. 8.

FIG. 10 shows in this respect an embodiment of the drive signals DRV1 and DRV2 generated by the control circuit 208a, and FIGS. 9A, 9B, 9C show the respective switching states of the pulse generator circuit.

Specifically, as shown in FIG. 10, the drive signals DRV1 and DRV2 generated by the control circuit 208a correspond to the drive signals shown in FIG. 4 (except for the voltage levels in order to e.g., generate the required gate-source voltages). Accordingly, the respective description concerning the time-intervals $T_1$, $T_2$, $T_3$ and $T_4$ apply also to the embodiment shown in FIG. 8.

For example, FIG. 9A shows the switching state for the time-interval $T_1$ (electronic switch S1 closed and electronic switch S2 opened). FIG. 9B shows the switching state for the time-intervals $T_2$ and $T_4$ (electronic switches S1 and S2 closed). Finally, FIG. 9C shows the switching state for the time-interval $T_3$ (electronic switch S1 opened and electronic switch S2 closed).

In various embodiments, the pulse generator circuit 20a may also be configured to sequentially apply pulses to a plurality of loads, such as a number N of laser diodes $D_1$, $D_2 \ldots D_N$.

Figure 11:
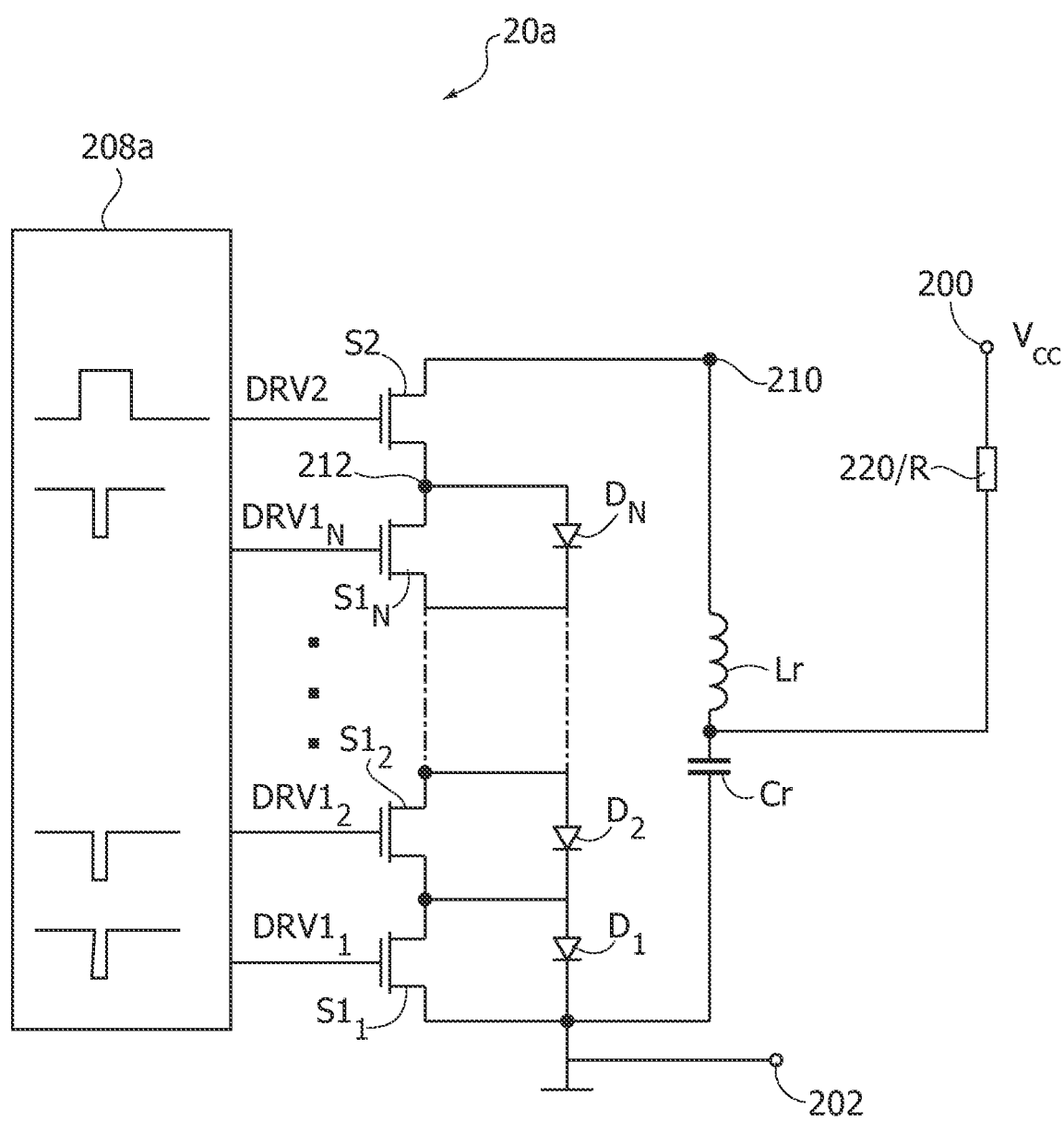
FIG. 11 shows a circuit schematic of a third embodiment of a pulse generator circuit.

For example, FIG. 11 shows an embodiment, wherein the laser diodes $D_1$, $D_2 \ldots D_N$ are connected in series between the node 212 and the terminal 202.

In the embodiment considered, the pulse generator circuit 20a comprises:
- a positive and a negative supply terminal 200 and 202 configured to receive the DC supply voltage Vcc, wherein the negative terminal 202 represents again a reference voltage, such as ground;
- an LC resonant circuit comprising an inductor Lr and a capacitor Cr connected (e.g., directly) in series between the node 210 and the terminal 202;
- a charge circuit 220, e.g., implemented with a resistance R connected (e.g., directly) between the terminal 200 and the intermediate node between the inductor Lr and the capacitor Cr;
- an electronic switch S2 configured to connected the node 212 to the LC resonant circuit, i.e. the electronic switch S2 is configured to connected the series connection of laser diodes $D_1$, $D_2 \ldots D_N$ in parallel with the LC resonant circuit, i.e. between the node 210 and the terminal 202;
- N electronic switches $S1_1 \ldots S1_N$, wherein each of the N electronic switches $S1_1 \ldots S1_N$ is configured to short-circuit a respective laser diode $D_1 \ldots D_N$;
- a control circuit 208a configured to generate the drive signal DRV2 for the electronic switch S2 and drive signals $DRV1_1 \ldots DRV1_N$ for the electronic switches $S1_1 \ldots S1_N$.

Specifically, in the embodiment considered, the drive signal DRV2 corresponds to the drive signal DRV2 described in the foregoing. Moreover, the control circuit 208a may be configured to apply the drive signal DRV1 described in the foregoing during each switching cycle to a respective single switch or plurality of switches $S1_1 \ldots S1_N$, i.e. in general to a respective subset of the switches $S1_1 \ldots S1_N$. Accordingly, a current pulse can be applied to one or more laser diodes $D_1 \ldots D_N$ when one or more switches $S_1 \ldots S1_N$ are opened during the time interval $T_3$ of a given switching cycle. With this solution it is thus possible to apply a current pulse to a plurality of laser diodes either at the same time or during different switching cycles. For example, in the way the pulse generator circuit 20a may apply a current pulse sequentially to all laser diodes, by opening sequentially during N switching cycles always a different electronic switch $S1_1 \ldots S1_N$.

Figure 12:
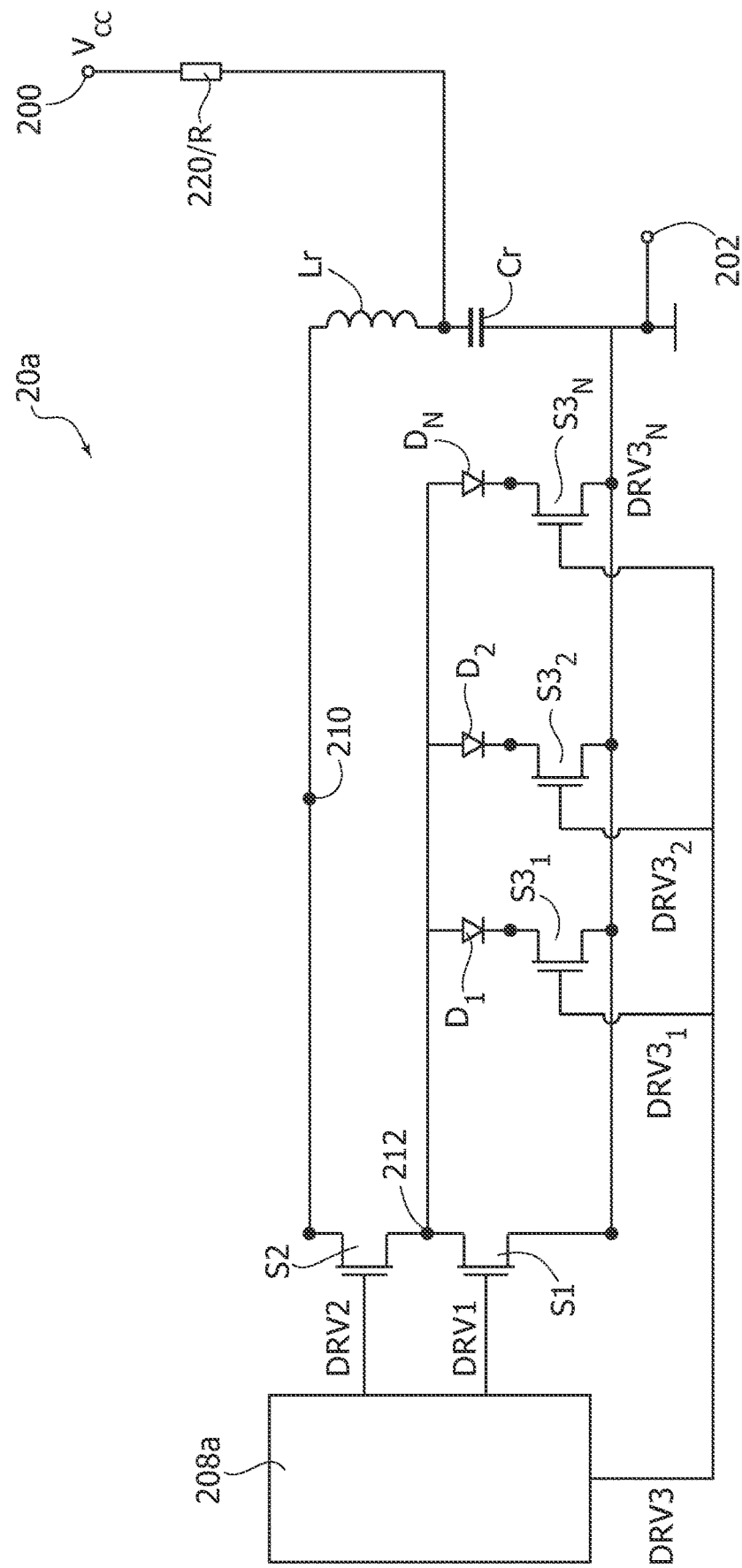
FIG. 12 shows a circuit schematic of a fourth embodiment of a pulse generator circuit.

Conversely, FIG. 12 shows an embodiment, wherein the laser diodes $D_1 \ldots D_N$ are connected in parallel between the node 212 and the terminal 202. Moreover, each electronic switch has connected in series a respective electronic switch $S3_1 \ldots S3_N$, i.e. each of the diodes $D_1 \ldots D_N$ is connected with a respective electronic switch $S3_1 \ldots S3_N$ between the node 212 and the terminal 202.

In the embodiment considered, the pulse generator circuit 20a comprises again:
- positive and a negative supply terminal 200 and 202 configured to receive the DC supply voltage Vcc, wherein the negative terminal 202 represents again a reference voltage, such as ground;
- an LC resonant circuit comprising an inductor Lr and a capacitor Cr connected (e.g., directly) in series between a node 210 and the terminal 202;
- a charge circuit 220, e.g., implemented with a resistance R connected (e.g., directly) between the terminal 200 and the intermediate node between the inductor Lr and the capacitor Cr;
- an electronic switch S2 configured to connected the node 212 to the LC resonant circuit, i.e. the electronic switch S2 is configured to connect the parallel connection of laser diodes $D_1$, $D_2 \ldots D_N$ in parallel with the LC resonant circuit, i.e. between the node 210 and the terminal 202;
- an electronic switch S1 configured to short-circuit the parallel connection of laser diode $D_1 \ldots D_N$; and
- a control circuit 208a configured to generate the drive signals DRV1 and DRV2 for the electronic switches S1 and S2 and drive signals $DRV3_1 \ldots DRV3_N$ for the electronic switches $S3_1 \ldots S3_N$.

Specifically, in the embodiment considered, the drive signals DRV1 and DRV2 correspond to the drive signals described in the foregoing, thereby generating during each time interval $T_3$ of the switching cycles a current pulse. Moreover, the control circuit 208a may be configured to generate the drive signals $DRV3_1 \ldots DRV3_N$ in order to close during each switching cycle a respective single switch $S3_1 \ldots S3_N$ or plurality of switches $S3_1 \ldots S3_N$. Accordingly, a current pulse can be applied to one or more laser diodes $D_1 \ldots D_N$ when one or more switches $S3_1 \ldots S3_N$ are closed during the time interval $T_3$ of a given switching cycle. With this solution it is thus again possible to apply a current pulse to a plurality of laser diodes either at the same time or with different timing. For example, in the way the pulse generator circuit 20a may again apply a current pulse sequentially to all laser diodes, by closing sequentially during N switching cycles always a different electronic switch $S3_1 \ldots S3_N$.

In general, the solutions shown in FIGS. 11 and 12 may similarly be used when the diodes $D_1 \ldots D_N$ are connected between the node 210 and the node 212. In this case, only the position of the electronic switches S1 and S2 have to be inverted. For example, for the case shown in FIG. 11, the electronic switch S2 could be connected between the node 212 and the terminal 202, and the electronic switches $S1_1 \ldots S1_N$ could be connected between the node 210 and the node 212, wherein a respective laser diode $D_1 \ldots D_N$ is connected in parallel with each electronic switch $S1_1 \ldots S1_N$.

In general, each of the laser diodes D mentioned in the foregoing could also be implemented with a plurality of laser diodes connected in parallel or preferably in series.

As described in the foregoing, the pulse generator circuit 20a and optionally the load 30/laser diodes D may be integrated in an integrated circuit.

Figure 13:
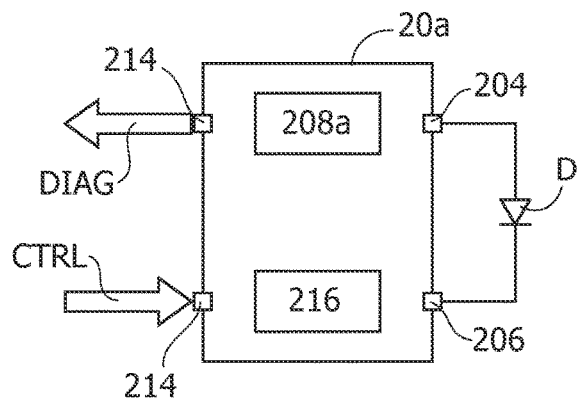
FIGS. 13 and 14 show embodiments of integrated circuits comprising a pulse generator circuit according to the present disclosure.

For example, FIG. 13 shows an embodiment, wherein the integrated circuit comprises pads/pins 204 and 206 for connection to an external diode D.

Moreover, FIG. 13 highlights that such an integrated circuit may comprise a communication interface 216, such as an Inter-Integrated Circuit ($I^2C$) or Serial Peripheral Interface (SPI), connected to one or more pads/pins 214 of the integrated circuit. For example, the control circuit 208a may be configured to use this communication interface 216 in order to receive control commands CTRL and/or send diagnostic data DIAG. For example, the control commands CTRL may include instruction indicating whether a current pulse should be applied to the diode D and/or data identifying the amplitude of the current pulse, e.g., data identifying the duration of the time interval $T_2$. Conversely, the diagnostic data DIAG may comprise data indicating the amplitude of the current pulse applied to the diode D. For example, for this purpose the pulse generator circuit 20a may comprise a current sensor connected in series with the diode D, the switch S2 or with the RC resonant circuit.

Figure 14:
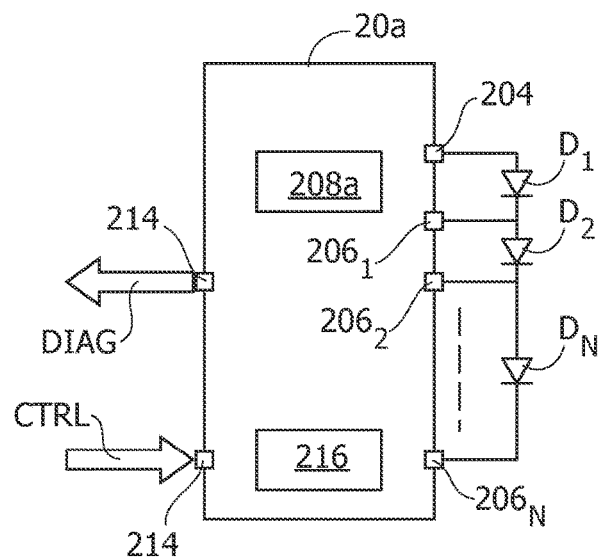

Similarly, FIG. 14 shows that the integrated circuit may also be connected to a plurality of external diodes $D_1 \ldots D_N$, such as an array or matrix of laser diodes as they are often used in LiDAR systems. For example, in FIG. 14, the integrated circuit comprises a pad/pin 204 and a plurality of pads/pins 2061 . . . 206N for connection to external diodes $D_1 \ldots D_N$.

Figure 15:
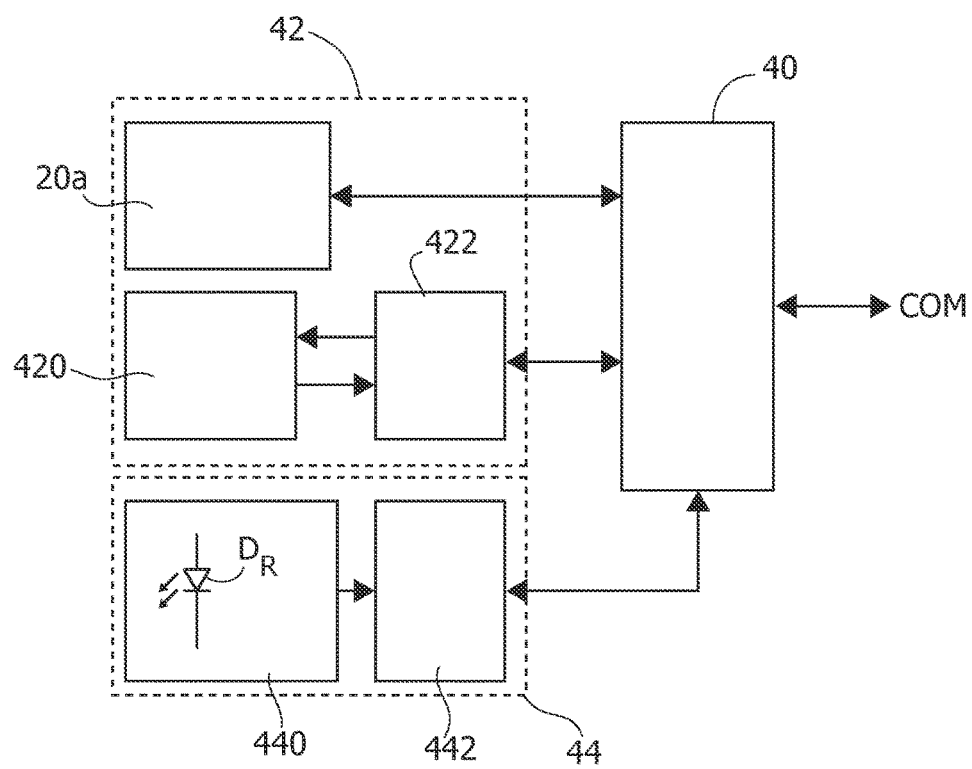
FIG. 15 shows a laser system comprising one or more pulse generator circuits according to the present disclosure.

FIG. 15 shows an embodiment of an electronic system comprising a pulse generator circuit 20a as described in the foregoing. Specifically, in the embodiment considered, the electronic system is a LiDAR system comprising:
- a transmitter portion 42 comprising:
  - one or more pulse generator circuits 20a configured to apply current pulses to a plurality of laser diodes, e.g., according to a given timing scheme;
  - a Micro-Electro-Mechanical Systems (MEMS) mirror 420 having associated a respective control circuit 422 in order to send actuation commands to the MEMS mirror 420 and optionally to receive position data from the MEMS mirror 420;
- a receiver portion 44 comprising a plurality of optical sensors 440, such as photo diodes $D_R$, configured to provide a signal to a respective measurement circuit 442; and
- a control and processing circuit 40 configured to provide control information to the pulse generator circuits 20a and the control circuit 422 associated with the MEMS mirror 420, and to receive and process the data received from the measurement circuit 440.

In various embodiment, the control and processing circuit 40 may be configured to exchange data COM with another electronic circuit, such as in order to send the processed data, e.g., data being indicative of the distance of one or more objects from the LiDAR system.

Accordingly, one or more of the described embodiments have the following advantages:
- a fast switching with rise and fall times in the 100 ps range may be obtained, which permits the generation of current pulses with a duration in the ins range (e.g., the duration of the time-interval $T_3$ may be selected in a range between 500 ps and 20 ns, preferably between 1 ns and 2 ns) with a current amplitude $i_{max}$ selected in a range between 5 A and 200 A, preferably between 10 A and 50 A.
- an easy control of the amplitude of the current pulse is possible by adapting the duration of the time interval $T_2$;
- the switching loop may be implemented directly in an integrated circuit, which permits to reduce parasitic inductances inside the commutation loop, e.g., below 0.1 nH; and
- the value of the supply voltage Vcc may be smaller than laser diode voltage drop.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A pulse generator circuit comprising:
   positive and negative input terminals for receiving a supply voltage;
   two output terminals for providing a current pulse to a load;
   an LC resonant circuit comprising an inductance and a capacitance connected in series between a first node and the negative input terminal, wherein the LC resonant circuit has a resonant period based on the inductance and the capacitance;
   a charge circuit configured to charge the capacitance via the supply voltage;
   a first electronic switch connected between the two output terminals and configured to selectively short-circuit the two output terminals in response to a first drive signal;
   a second electronic switch configured to selectively connect the two output terminals in parallel with the LC resonant circuit in response to a second drive signal; and
   a control circuit configured to generate the first and the second drive signals in order to repeat the following steps during each switching cycle of a sequence of switching cycles:
   for a first time-interval, close the first electronic switch and open the second electronic switch, wherein the two output terminals are disconnected from the LC resonant circuit and wherein the capacitance is charged via the charge circuit;
   for a following second time-interval, close the first electronic switch and close the second electronic switch, wherein the two output terminals are connected in parallel with the LC resonant circuit and the two output terminals are short-circuited, and wherein the LC resonant circuit oscillates with the resonant period;
   for a following third time-interval, open the first electronic switch and close the second electronic switch, wherein the two output terminals are connected in parallel with the LC resonant circuit and wherein the LC resonant circuit provides a current to the two output terminals; and
   for a following fourth time-interval, close the first electronic switch and close the second electronic switch, wherein the two output terminals are connected in parallel with the LC resonant circuit, wherein the two output terminals are short-circuited, and wherein the LC resonant circuit oscillates with the resonant period.

2. The pulse generator circuit according to claim 1, wherein the current provided by the LC resonant circuit oscillates with a maximum current value and wherein the control circuit is configured to start the third time-interval in response to the current provided by the LC resonant circuit reaching the maximum current value.

3. The pulse generator circuit according to claim 1, wherein a duration of the second time-interval is selected in a range between 90% and 110% of one-fourth of the given resonant period.

4. The pulse generator circuit according to claim 1, wherein the current provided by the LC resonant circuit oscillates with a maximum current value and wherein the control circuit is configured to:
receive data identifying a requested current amplitude to be provided to the two output terminals; and
determine a duration of the second time-interval based on the data identifying the requested current amplitude.

5. The pulse generator circuit according to claim 1, wherein the control circuit is configured to start the first time-interval in response to the current provided by the LC resonant circuit reaching zero.

6. The pulse generator circuit according to claim 1, wherein a duration of the fourth time-interval is selected such that a sum of durations of the second, third and fourth time-intervals is in a range between 90% and 110% of the resonant period.

7. The pulse generator circuit according to claim 1, wherein a duration of the third time-interval is selected in a range between 500 ps and 20 ns.

8. The pulse generator circuit according to claim 1, wherein the first and second electronic switches are connected in series between the first node and the negative input terminal, wherein the first electronic switch is connected to the first node and the second electronic switch is connected to the negative input terminal, and wherein the two output terminals are connected to the first node and to an intermediate node between the first and second electronic switches, respectively.

9. The pulse generator circuit according to claim 1, wherein the first and second electronic switches are connected in series between the first node and the negative input terminal, wherein the second electronic switch is connected to the first node and the first electronic switch is connected to the negative input terminal, and wherein the two output terminals are connected to an intermediate node between the first and the second electronic switch and to the negative input terminal, respectively.

10. The pulse generator circuit according to claim 1, wherein the inductance is connected to the first node and the capacitance is connected to the negative input terminal, and wherein the charge circuit comprises a resistance and a third electronic switch connected between a positive supply terminal and an intermediate node between the inductance and the capacitance.

11. The pulse generator circuit according to claim 1, further comprising:
more than one of the first electronic switch connected in series, wherein respective output terminals are connected to each of the more than one of first electronic switch; or
a plurality of third electronic switches, each third electronic switch configured to connect the respective output terminals in parallel with the first electronic switch.

12. A laser system, comprising:
a pulse generator circuit comprising:
positive and negative input terminals for receiving a supply voltage;
two output terminals for providing a current pulse to a load;
an LC resonant circuit comprising an inductance and a capacitance connected in series between a first node and the negative input terminal, wherein the LC resonant circuit has a resonant period based on the inductance and the capacitance;
a charge circuit configured to charge the capacitance via the supply voltage;
a first electronic switch connected between the two output terminals and configured to selectively short-circuit the two output terminals in response to a first drive signal;
a second electronic switch configured to selectively connect the two output terminals in parallel with the LC resonant circuit in response to a second drive signal; and
a control circuit configured to generate the first and the second drive signals; and
a laser diode connected to the two output terminals.

13. The laser system according to claim 12, wherein the laser system is a light detection and ranging (LiDAR) system comprising:
a transmitter section comprising:
one or more of the pulse generator circuit configured to apply respective current pulses to a plurality of laser diodes; and
a micro-electromechanical system (MEMS) mirror with an associated control circuit;
a receiver section comprising a plurality of optical sensors with an associated measurement circuit; and
a control and processing circuit configured to:
control the one or more of the pulse generator circuit;
control the control circuit associated with the MEMS mirror; and
receive and process data received from the associated measurement circuit.

14. A method of operating a pulse generator circuit comprising positive and negative input terminals for receiving a supply voltage; two output terminals for providing a current pulse to a load; an LC resonant circuit comprising an inductance and a capacitance connected in series between a first node and the negative input terminal, wherein the LC resonant circuit has a resonant period based on the inductance and the capacitance; a charge circuit configured to charge the capacitance via the supply voltage; a first electronic switch connected between the two output terminals and configured to selectively short-circuit the two output terminals in response to a first drive signal; and a second electronic switch configured to selectively connect the two output terminals in parallel with the LC resonant circuit in response to a second drive signal; the method comprising repeating the following steps during a sequence of switching cycles:
for a first time-interval, closing the first electronic switch and opening the second electronic switch, to disconnect the two output terminals from the LC resonant circuit, and to charge the LC resonant circuit via the charge circuit;
for a following second time-interval, closing the first electronic switch and closing the second electronic switch, to connect the two output terminals in parallel with the LC resonant circuit, to short-circuit the two output terminals, and to oscillate the LC resonant circuit with the resonant period;
for a following third time-interval, opening the first electronic switch and closing the second electronic switch, to connect the two output terminals in parallel with the LC resonant circuit, and to provide, by the LC resonant circuit, a current to the two output terminals; and for a following fourth time-interval, closing the first electronic switch and closing the second electronic switch, to connect the two output terminals in parallel with the LC resonant circuit, to short-circuit the two output terminals, and to oscillate the LC resonant circuit with the resonant period.

15. The method according to claim 14, further comprising:

oscillating the current provided by the LC resonant circuit with a maximum current value; and starting the third time-interval in response to the current provided by the LC resonant circuit reaching the maximum current value.

16. The method according to claim 14, further comprising selecting a duration of the second time-interval to be in a range between 90% and 110% of one-fourth of the resonant period.

17. The method according to claim 14, further comprising:

oscillating the current provided by the LC resonant circuit with a maximum current value;

receiving data identifying a requested current amplitude to be provided to the two output terminals; and determining a duration of the second time-interval based on the data identifying the requested current amplitude.

18. The method according to claim 14, further comprising starting the first time-interval in response to the current provided by the LC resonant circuit reaching zero.

19. The method according to claim 14, further comprising selecting a duration of the fourth time-interval such that a sum of durations of the second, third and fourth time-intervals is in a range between 90% and 110% of the resonant period.

20. The method according to claim 14, further comprising selecting a duration of the third time-interval to be in a range between 500 ps and 20 ns.

* * * * *

UNITED STATES PATENT AND TRADEMARK OFFICE
CERTIFICATE OF CORRECTION

| | | |
|---|---|---|
| PATENT NO. | : 12,278,460 B2 | Page 1 of 1 |
| APPLICATION NO. | : 17/123712 | |
| DATED | : April 15, 2025 | |
| INVENTOR(S) | : Letor et al. | |

It is certified that error appears in the above-identified patent and that said Letters Patent is hereby corrected as shown below:

In the Claims

In Column 15, Line 57 and 58, Claim 11:
Change "each of the more than one of first electronic switch; or"
To --each of the more than one of the first electronic switch; or--.

Signed and Sealed this
Twentieth Day of May, 2025

Coke Morgan Stewart
*Acting Director of the United States Patent and Trademark Office*